United States Patent [19]
Murray et al.

[11] Patent Number: 5,844,296
[45] Date of Patent: Dec. 1, 1998

[54] SPACE SAVING LASER PROGRAMMABLE FUSE LAYOUT

[75] Inventors: Michael A. Murray, Bellevue, Wash.; Lawrence C. Liu, San Jose; Li-Chun Li, Los Gatos, both of Calif.

[73] Assignee: Mosel Vitelic Corporation, San Jose, Calif.

[21] Appl. No.: 717,471

[22] Filed: Sep. 20, 1996

[51] Int. Cl.⁶ .............................. H01L 27/10; H01L 29/00
[52] U.S. Cl. ...................... 257/529; 257/202; 257/207; 257/208; 257/209; 257/528; 438/6; 438/132; 365/225.7
[58] Field of Search .................................. 257/208, 209, 257/529, 528, 202, 207; 437/41, 51, 60; 438/6, 132; 365/225.7

[56] References Cited

U.S. PATENT DOCUMENTS 5,545,904  8/1996  Orbach .................................. 257/529
5,636,172  6/1997  Prall et al. ........................... 365/225.7

*Primary Examiner*—Valencia Martin Wallace
*Attorney, Agent, or Firm*—Skjerven, Morrill, MacPherson, Franklin & Friel LLP; Alan H. MacPherson; David T. Millers

[57] ABSTRACT

A compact laser programmable fuse structure has a central line and two sets of fuses extending from opposite sides of the central line. An opening through a passivation layer exposes the fuses and overlies the central line. In one embodiment, the opening also exposes the portions of the central line. The central line is made of fuse material or another material for which the opening does not create reliability problems. In one embodiment of the invention, the central line and the fuses are parts of a single contiguous region of polysilicon. This fuse structure has a length that is about half the length of conventional fuse structure having the same number of fuses because two fuses, one on either side of the central line, fit within a length used for a single fuse in conventional fuse structures.

10 Claims, 2 Drawing Sheets

SPACE SAVING LASER PROGRAMMABLE FUSE LAYOUT

BACKGROUND OF THE INVENTION

1. Field of the Invention

This invention relates to semiconductor structures and particularly to laser programmable fuses.

2. Description of Related Art

Laser programmable fuses are well known semiconductor devices commonly employed to configure an integrated circuit after manufacture. An exemplary application of such fuses is in a memory such as a DRAM where programming fuses selects spare memory cells that replace defective memory cells. In such applications, a memory is tested to detect any defects, and a laser cuts fuses selected according to the results of the test. In particular, fuses are cut or left intact to select an address to which spare memory cells respond.

FIG. 1 shows a laser programmable fuse structure 100 having fuses 111 to 116 which connect respective drivers (pull-down transistors) 121 to 126 and a common node 150. Each of drivers 121 to 126 corresponds to a bit or the complement of a bit in an address signal for a row, column, or sector of memory cells. Node 150 is associated with selection circuitry for a set of memory cells. For normal operation, all of fuses 111 to 116 are intact; and any address signal turns on at least one of drivers 121 to 126 which pulls node 150 to a low voltage. Node 150 being low enables selection of a regular memory cell corresponding to the address signal. If a regular memory cell is defective, some of fuses 111 to 116 are cut so that an address signal corresponding to the defective memory cell does not turn on any of the drivers 121 to 126 that are still connected to node 150. A pull-up device 160 keeps node 150 at a high voltage for the address signal corresponding to the defective memory cell which causes a spare memory cell to respond to the address signal.

An opening 130 through a passivation layer 170 exposes fuses 111 to 116 and permits trimming of fuses 111 to 116 so that a spare memory cell is selected when required. Fuses 111 to 116 are not protected by passivation layer 170 and are made of a material such as polysilicon that opening 130 can expose without causing reliability problems. Structures which might be damaged by proximity to opening 130 or by the laser trimming are kept outside an area 140 surrounding opening 130. Opening 130 thus controls the size of fuse structure 100 and has a width w that depends on the accuracy of the laser trimming and a length l that depends on the product of the number of fuses times the sum of the fuse width and the spacing required between fuses. The size of fuse structure 100 is a concern in integrated circuit layout. In particular, some integrated circuits may be unable to easily accommodate the length l of fuse structure 100.

SUMMARY OF THE INVENTION

In accordance with an aspect of the invention, a compact laser programmable fuse structure has dimensions that are convenient for many integrated circuit layouts. One embodiment of the invention includes a central line which connects to a common node. A first set of fuses extends out from one side of the central line, and a second set of fuses extends out from an opposite side of the central line. This fuse structure has a length that is about half the length of a conventional fuse structure having the same number of fuses because two fuses, one on either side of the central line, fit within a length used for a single fuse in a conventional fuse structure.

An opening through an overlying passivation layer exposes the fuses for trimming and may expose a portion of the central line. The central line is accordingly made of fuse material or another substance for which the opening does not create reliability problems. In one embodiment of the invention, the central line and fuses are parts of a single contiguous region of polysilicon.

BRIEF DESCRIPTION OF THE DRAWINGS

Use of the same reference symbols in different figures indicates similar or identical items.

DETAILED DESCRIPTION OF THE PREFERRED EMBODIMENT

Figure 1:
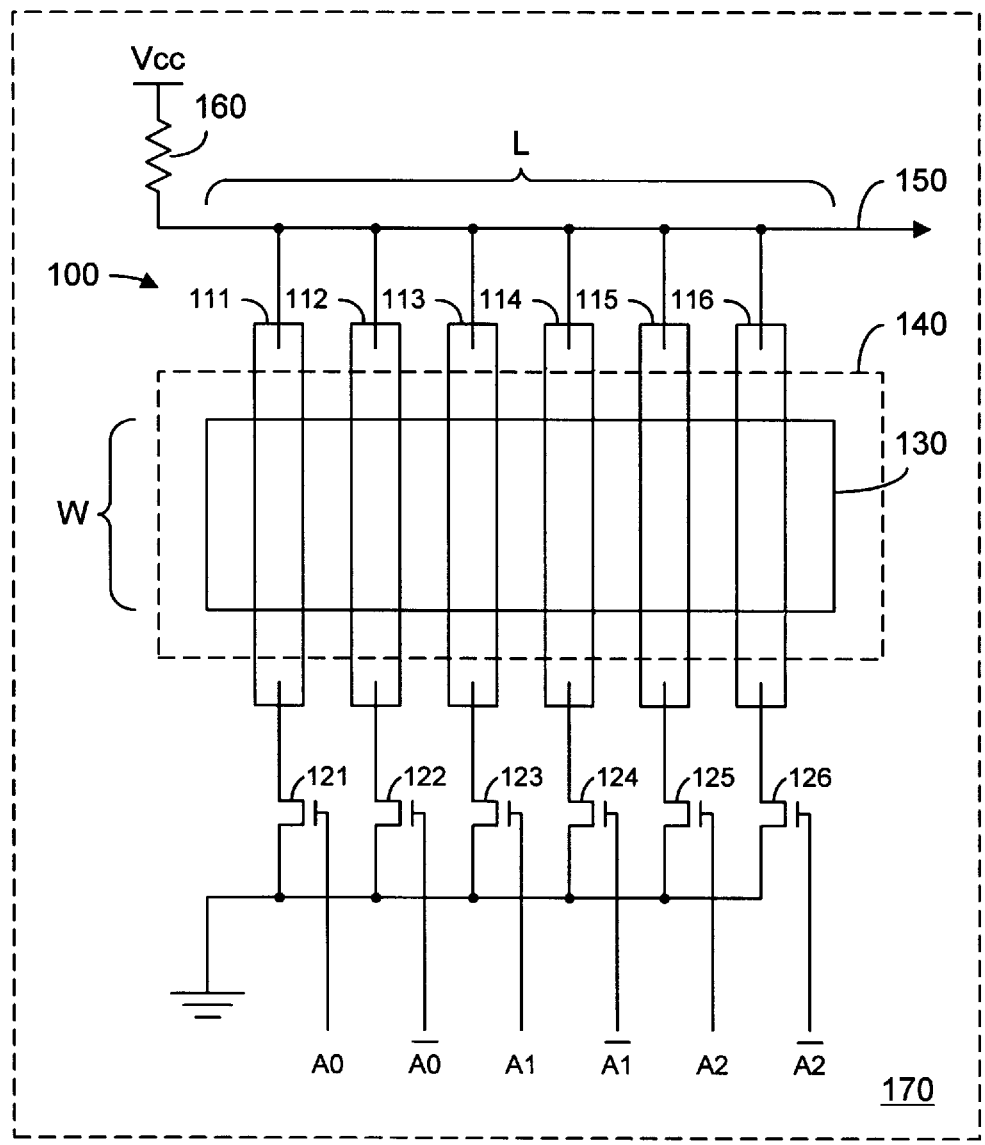
FIG. 1 shows a prior art laser programmable fuse structure.

In accordance with an embodiment of the invention, a laser programmable fuse structure includes a central line made of a material such as polysilicon which can be exposed by an opening through a passivation layer of an integrated circuit. The central line couples to a common node, and fuses made of a fuse material extend from two sides of the central line to connect circuitry to the central line and common node. In accordance with one aspect of the invention, a length of the opening accommodates twice as many fuses as a conventional fuse structure such as shown in FIG. 1.

Figure 2:
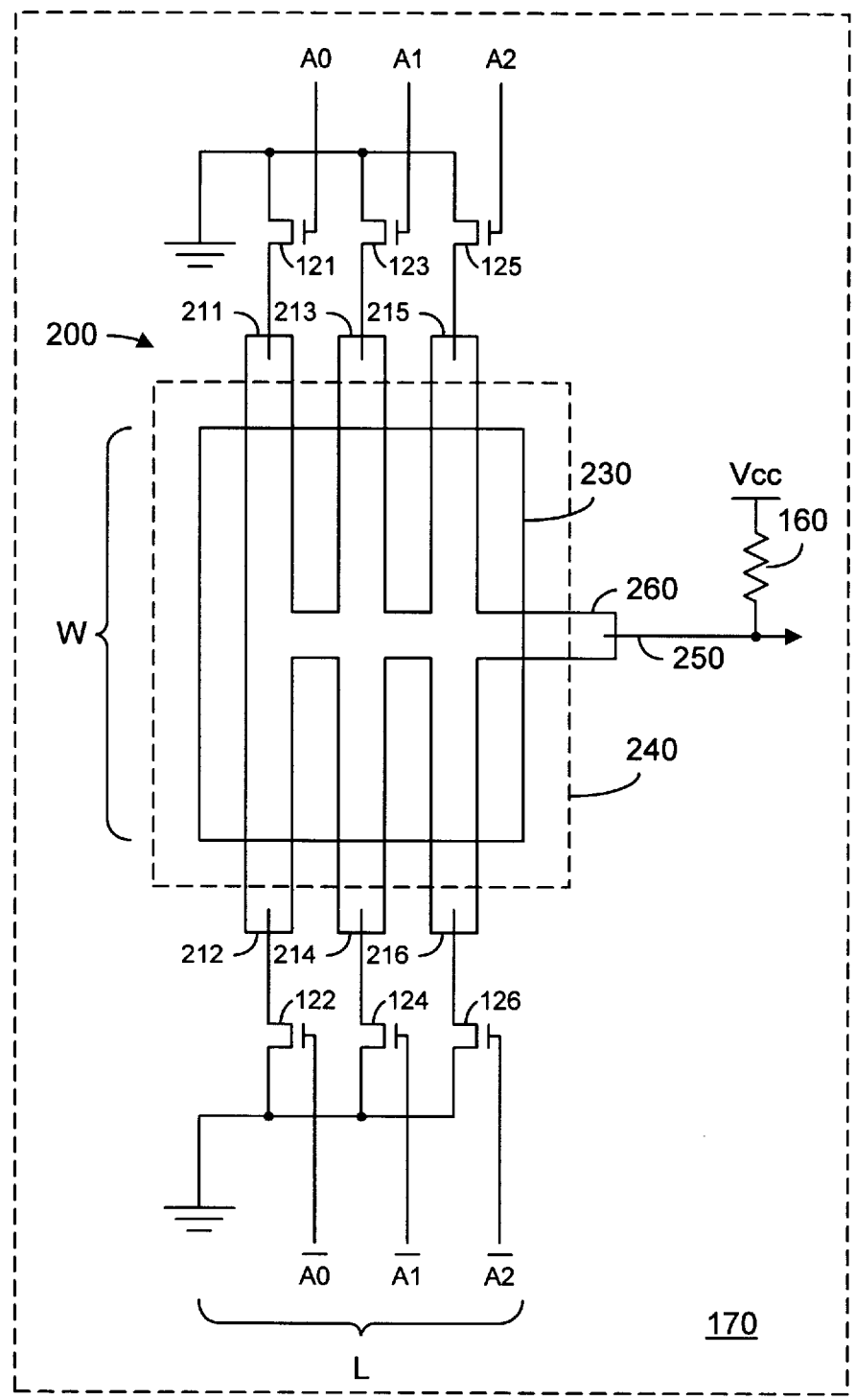
FIG. 2 shows a laser programmable fuse structure in accordance with an embodiment of the invention.

FIG. 2 shows the layout of a fuse structure 200 in accordance with an embodiment of the invention. Fuse structure 200 includes six laser programmable fuses 211 to 216 although any number of fuses could be employed in alternative embodiments of the invention. A more typical application, for example, might employ 20 fuses associated with a 10-bit address signal and a 10-bit compliment of the address signal. Fuses 211 to 216 connect circuitry (respective drivers 121 to 126) to a central line 260 and through central line 260 to a common node 250. In an exemplary embodiment, fuse structure 200 is in a DRAM, and fuses 211 to 216 are trimmed with a laser to select an address for spare memory cells. The combination of fuses 211 to 216 which remain intact after programming controls which drivers 121 to 126 are connected to node 250 and which address signals cause node 250 to be pulled down to a low voltage. Alternatively, fuse structure 200 can connect any sort of circuitry to node 250 where the circuity controls the voltage of node 250 or where node 250 controls a voltage in the connected circuitry.

Fuse structure 200 can be manufactured using well known semiconductor processes. Initially, a substrate (typically silicon) is doped to form N+ guard ring surrounding an area 240 over which fuse structure 200 will be formed. The guard ring collects electrons and protects against the effects generated by defects such as crystal damage that laser trimming may create in the substrate. A polysilicon layer is deposited on an insulating layer overlying the substrate and is patterned to form a contiguous region 210 which includes fuses 211 to 216 and central line 260. Subsequent processing forms an insulating layer such as a silicon dioxide or doped glass layer over the patterned polysilicon layer and openings through the insulating layer for vias to region 210. A metal layer is deposited and patterned to form metal traces such as node 250 which contacts central line 260 through the openings in the insulating layer. After completing formation of active elements, a passivation (or Vapox) layer 170 is formed over the entire structure and an opening 230 is formed to permit laser trimming which cuts fuses 211 to 216. Area 240 surrounding the perimeter of opening 230 is free of structures whose reliability would be harmed by laser trimming or by being near an opening through passivation layer 170. Standard design rules currently keep everything except fuse material about 4 to 5 µm away from the boundary of opening 230 to maintain passivation protection.

Opening 230 has a width W that is about twice the fuse length to accommodate fuses extending from two sides of central line 260. In the exemplary embodiment, width W is about 20 µm to accommodate two 9-µm exposed lengths of fuses and a 1-µm width of central line 260. A length L of opening 230 depends on the number of fuses coupled to node 250 before trimming. In the exemplary embodiment shown in FIG. 2, length L is about three times 3.3 µm which is sufficient for three pairs of fuses, each of which is about 0.5 µm wide and separated from the next fuse by about 2.8 µm.

When compared to opening 130 for the fuse structure of FIG. 1, opening 230 is about twice as wide and half as long making the areas of openings 130 and 230 about the same (six times the fuse size and tolerance for laser trimming). However, fuse structure 200 can use less integrated circuit area than does fuse structure 100 if the surrounding area 240 is smaller than area 140. Area 240 will be smaller when opening 230 is more square than opening 130 because a squarer opening has a smaller perimeter and requires less surrounding area to be free of metal. For an application requiring 20 fuses, area 240 is 10% to 15% smaller than area 140.

Another advantage of structure 200 arises in integrated circuits which cannot accommodate a single long fuse structure such as fuse structure 100. Using two fuse structures such as structure 100 connected to a single node cuts the length of each of the structures about in half, but the sum of the perimeters of two openings for such openings is about 2 L greater than the perimeter of fuse structure 200. Accordingly, fuse structure 200 requires significantly less integrated circuit area than does two fuse structures.

Although the invention has been described with reference to a particular embodiment, the description is only an example of the invention's application and should not be taken as a limitation. Various adaptations of features of the embodiment disclosed are within the scope of the invention as defined by the following claims.

We claim:

1. A fuse structure comprising:

a central line;

a first fuse coupled to a first edge of the central line;

a second fuse coupled to a second edge of the central line, wherein the second edge is opposite the first edge; and a passivation layer overlying a first portion of the central line, a first portion of the first fuse, and a first portion of the second fuse, the passivation layer having a contiguous opening that exposes a second portion of the first fuse, a second portion of the second fuse, and a second portion of the central line, the opening being sufficient to permit trimming of the first fuse and the second fuse.

2. The fuse structure of claim 1, wherein the central line, the first fuse, and the second fuse constitute portions of a single contiguous region.

3. The fuse structure of claim 2, wherein the single contiguous region comprises polysilicon.

4. The fuse structure of claim 1, further comprising:

a first circuit coupled to the first fuse;

a second circuit coupled to the second fuse; and a third circuit coupled to the central line, wherein trimming the first fuse or the second fuse selects whether the first circuit or the second circuit is electrically coupled to the third circuit.

5. The fuse structure of claim 1, further comprising:

a first plurality of fuses coupled to the first edge of the central line, the first plurality including the first fuse; and a second plurality of fuses coupled to the second edge of the central line, the second plurality including the second fuse, wherein the opening through the passivation layer exposes a portion of each fuse in the first plurality of fuses and each fuse in the second plurality of fuses, and permits trimming of any fuse in the first plurality of fuses and any fuse in the second plurality of fuses.

6. The fuse structure of claim 5, wherein the central line and the first and second pluralities of fuses constitute portions of a single contiguous region.

7. The fuse structure of claim 6, wherein the single contiguous region comprises polysilicon.

8. The fuse structure of claim 5, further comprising:

a first circuit coupled to the central line; and a plurality of circuits, each of the circuits being coupled to a corresponding one of the fuses in the first and second pluralities of fuses, wherein trimming the fuses selects which, if any, of the circuits from the plurality of circuits are electrically coupled to the first circuit.

9. The fuse structure of claim 5, wherein the opening exposes portions of each fuse in the first plurality of fuses and each fuse in the second plurality of fuses.

10. The fuse structure of claim 1, wherein the opening exposes a location where the first fuse couples to the first edge of the central line and a location where the second fuse couples to the second edge of the central line.

* * * * *